US011039517B2

(12) United States Patent
Li et al.

(10) Patent No.: US 11,039,517 B2
(45) Date of Patent: Jun. 15, 2021

(54) FRACTION PWM WITH MULTIPLE PHASE DISPLAY CLOCK

(71) Applicant: SCT LTD., Grand Cayman (KY)

(72) Inventors: Eric Li, Milpitas, CA (US); Shean-Yih Chiou, Milpitas, CA (US); Shang-Kuan Tang, Milpitas, CA (US); Juinn-Yan Chen, Milpitas, CA (US); Yi Zhang, Milpitas, CA (US); Zhenchao Liu, Guangdong (CN)

(73) Assignee: SCT LTD., Grand Cayman (KY)

( * ) Notice: Subject to any disclaimer, the term of this patent is extended or adjusted under 35 U.S.C. 154(b) by 0 days.

(21) Appl. No.: 16/889,301

(22) Filed: Jun. 1, 2020

(65) Prior Publication Data

US 2021/0112641 A1 Apr. 15, 2021

Related U.S. Application Data

(60) Provisional application No. 62/827,617, filed on Apr. 1, 2019.

(51) Int. Cl.
*H05K 5/00* (2006.01)
*H03K 7/08* (2006.01)
*H03L 7/00* (2006.01)
*H05B 45/325* (2020.01)

(52) U.S. Cl.
CPC .................................. *H05B 45/325* (2020.01)

(58) Field of Classification Search
CPC ...... H05B 45/30; H05B 45/32; H05B 45/325; G09G 3/32; G09G 3/3283; H03L 7/00; H03L 7/08; H03L 7/091; H03K 5/00; H03K 7/08; H03K 3/017; H03K 5/133
See application file for complete search history.

(56) References Cited

U.S. PATENT DOCUMENTS

| | | | |
|---|---|---|---|
| 7,088,155 B2 * | 8/2006 | Takahashi | H03L 7/07 327/144 |
| 8,947,145 B2 * | 2/2015 | Fujiwara | H05B 45/00 327/175 |
| 10,541,689 B1 * | 1/2020 | Chang | H03L 7/07 |
| 2009/0051397 A1 * | 2/2009 | Jung | H03K 5/1515 327/173 |

* cited by examiner

*Primary Examiner* — Thai Pham
(74) *Attorney, Agent, or Firm* — Novick, Kim & Lee, PLLC; Allen Xue

(57) ABSTRACT

A method for generating fractional PWM pulses to drive an light emitting device includes generating multiphase clock signals using a multiphase PLL or DLL includes the steps of generating a plurality of phases of PWM pulses that correspond to a number of phases of the multiphase clock signals, selecting two or more phases amongst the plurality of PWM pulses, performing logic operations of the selected phases of PWM pulses to generate fractional PWM pulses, and generating a driving current using the fractional PWM pulses in a current source. The light emitting device is can be an LED display comprising an LED array having a plurality of channels and a plurality of scan lines. The driving current drives LEDs in one of the plurality of channels.

15 Claims, 11 Drawing Sheets

FRACTION PWM WITH MULTIPLE PHASE DISPLAY CLOCK

RELATED APPLICATION

This application claims the benefit of priority under 35 U.S.C. § 119 to U.S. Provisional Application No. 62/827,617, filed on Apr. 1, 2019, the entire contents of which are incorporated herein by reference.

BACKGROUND

1. Field of Technology

This disclosure provides method and system to generate PWM pulses, to drive a light emitting devices, particularly related to generating fraction PWM pulses.

2. Description of Related Art

Small, high resolution LED displays demand small LED pitch size. Smaller LED displays present unique challenges for the LED driver in that each LED driver has to drive more pixels and at a higher resolution (i.e., high Gray Scale bit numbers). Further, the driving current decreases due to the increases in the LED light efficiency so that the rise time of the LEDs may be longer. To meet these technical challenges, one of the solutions is to implement a higher scan number for the LED driver so that it drives more pixels and at a reduced the average current. However, at a same high Gray Scale bit number, more scan number means that more PWM pulses would have to fit in one frame period. In the other words, the PWM pulse resolution shall be higher.

FIG. 1 demonstrates the relation between GCLK and a PWM pulse. In this case, the width of the PWM pulse equals four GCLK cycles. The PWM engine creates the PWM pulses by using a single phase GCLK. A smaller PWM pulse width means a higher PWM pulse resolution. The highest resolution is when the minimum PWM pulse width equals one GCLK cycle. For example, the PWM pulse resolution when the pulse width is one GCLK cycle is four times the resolution when the pulse width is four GCLK cycles.

Accordingly, the GCLK number in a frame defines the minimum PWM pulse width so that a higher PWM pulse resolution requires a faster GCLK. One option is to place a clock, e.g., a phase-locked loop (PLL) or a delay-locked Loop (DLL), on the LED driver chip and generates a high speed (i.e., high frequency) internal clock to handle data transmission between receivers and LED drivers. However, running the LED driver at a high frequency consumes more power. In addition, once the GCLK frequency surpasses a certain level, more advanced and costly hardware may be required.

Another technical challenge for small, high resolution displays is that, due to the bigger load and the smaller current, it takes a longer rise time ($T_r$) for the LED to reach its forward voltage (Vf) voltage, causing delays in turning on the LED and other abnormalities. Since the parasitic resistance, inductance, and capacitance of PCB and LED vary among pixels, a flat slope in $T_r$ further exacerbates non-uniformity of the LED display at a low brightness level.

As an example, an LED display having 80 RGB channels, 96 scan lines, 16 bits gray scale, and running at 60 Hz frame rate and 1920 refresh rate, the time period for each scan line is:

$$\text{Period}_{scan}=1\text{ s}\div1920\div96=5.43\text{ us.}$$

In a conventional PCB layout shown in FIG. 11, the current source drives 96 LEDs in each channel, i.e., the loading is 96 LEDs. Each scan output drives 80×3 LEDs. Assuming the LED parasitic capacitance is about 10 pf and the driving current is about 1 mA, and Vf of the LED is 2.8 V, the rise time is:

$$T_r = 10pf * 96 * \frac{2.8\text{ v}}{1\text{ mA}} = 2.69\ us.$$

As shown in this example, $T_r$ is almost half of $\text{Period}_{scan}$. In the other words, in about half display period, the LED is in a nonlinear and abnormal state.

Accordingly, there is a need for systems and methods that increase the resolution of PWM pulses. There is also a need to reduce the rise time and increase the uniformity in small, high resolution LED displays.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, the current disclosure provides a system for generating PWM pulses to drive an LED array. The system includes a system clock that outputs a plurality of phases, e.g., n phases, of clock signals; a demultiplexier circuit that separates PWM data into an integer section and a fraction section; a pulse generator circuit that outputs a first phase PWM pulses using inputs comprising the integer section of the PWM data and a first phase among the n phases of clock signals; a sampler circuit that outputs a second phase PWM pulses using inputs comprising the first phase PWM pulses and the second to n phases of clock signals; a multiplexer that outputs a selected phase of PWM pulses using inputs comprising the second phase PWM pulses and the fraction section of the PWM data; and a fraction logic circuit that outputs fraction PWM pulses using inputs comprising the first phase PWM pulses, the selected phase of PWM pulses, the integer section of the PWM data, and the fraction section of the PWM data.

One of the embodiments of the system further includes a plurality of current sources. Each current source is configured to receive fraction PWM pulses from the fraction logic circuit and to output a corresponding driving current to an LED array.

Another embodiment of the system includes a first memory for storing the integer section of the PWM data and a second memory for storing the fraction section of the PWM data.

In an further embodiment of the system, the system clock, the demultiplexier circuit, the first memory, the second memory, the pulse generator circuit, the sampler circuit, the multiplexer, and the fraction logic circuit are disposed on an LED driver chip.

In some embodiments of the system, wherein n represents an integer of two or more, e.g., 2, 4, 6, 8, 10, or 12.

In some other embodiments of the system, the system clock is a phase-locked loop or a delay-locked loop.

In additional embodiments of the system, the PWM data is of 16 bits and wherein the fraction section is of one or two bits.

In another general aspect of the current disclosure, the method for generating PWM pulses includes generating clock signals having at least a first phase and a second phase using the multiphase system clock; separating PWM data into an integer section and a fraction section in the demultiplexer; inputting, into the pulse generator circuit, the integer section of the PWM data and a first phase among the clock signals circuit and outputting a first phase PWM pulses; inputting, into the sampler circuit, the first phase PWM pulses and the second phase of clock signals and outputting a second phase PWM pulses; inputting, into the multiplexer, the second phase PWM pulses and the fraction section of the PWM data and outputting a selected phase of PWM pulses; and performing the logic operation of the first phase PWM pulses and the selected phase of PWM pulses in the fraction logic circuit to generate fraction PWM pulses.

In yet another general aspect of the current disclosure, the method for generating fractional PWM pulses to drive an light emitting device, includes the steps of generating multiphase clock signals using a fractional PLL or a fractional DLL; generating a plurality of phases of PWM pulses that correspond to a number of phases of the multiphase clock signals; selecting two or more phases amongst the plurality of PWM pulses; performing logic operations of the selected phases of PWM pulses to generate fractional PWM pulses; generating a driving current using the fractional PWM pulses in a current source.

In some embodiments, the multiphase clock signals have 2 to 12 phases.

In other embodiments, the light emitting device is an LED display includes an LED array having a plurality of channels and a plurality of scan lines, and the driving current drives LEDs in one of the plurality of channels.

Other features and aspects will be apparent from the following detailed description, the drawings, and the claims.

Figure 1:
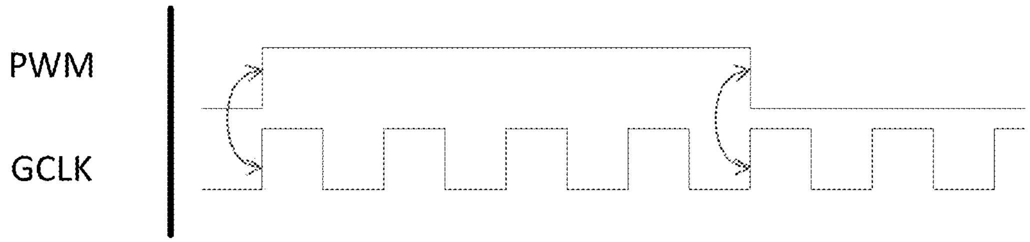
FIG. 1 illustrates the relation between GCKL cycles and the PWM pulse.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 2:
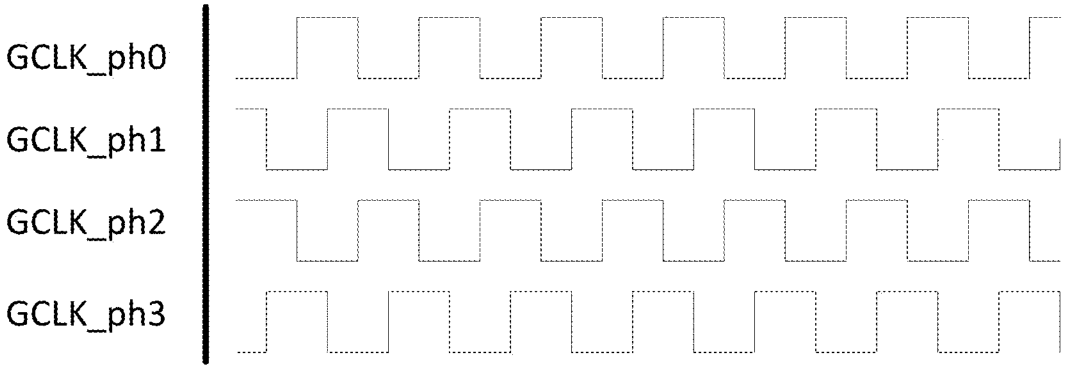
FIG. 2 shows GCLK with four different phases generated by PLL or DLL.

FIG. 2 shows four different phases of GCLK cycles generated using PLL or DLL, GCLK_ph0, GCLK_ph1, GCLK_ph2, and GCLK_ph3. Each phase is 90° apart for the adjacent one, which translates to ¼ GCLK cycle in time difference between adjacent clocks. Such phase shifts can be accomplished by PLL or DLL circuitry design, e.g., using fractional PLL, which is known in the art.

Figure 3:
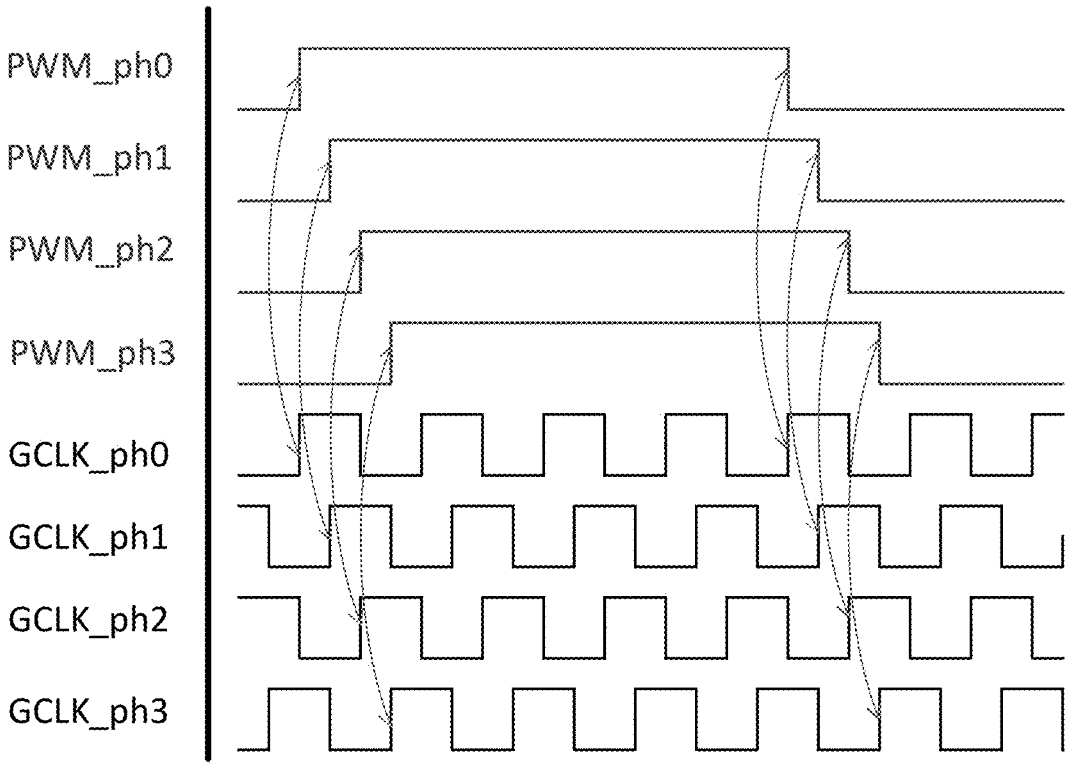
FIG. 3 shows four GCLK phases each generates a corresponding PWM signal.

FIG. 3 shows that four phases of GCLK cycles generate four corresponding PWM pulses: PWM_ph0, PWM_ph1, PWM_ph2, and PWM_ph3. The time difference between adjacent PWM pulses is ¼ GCLK.

Figure 4:
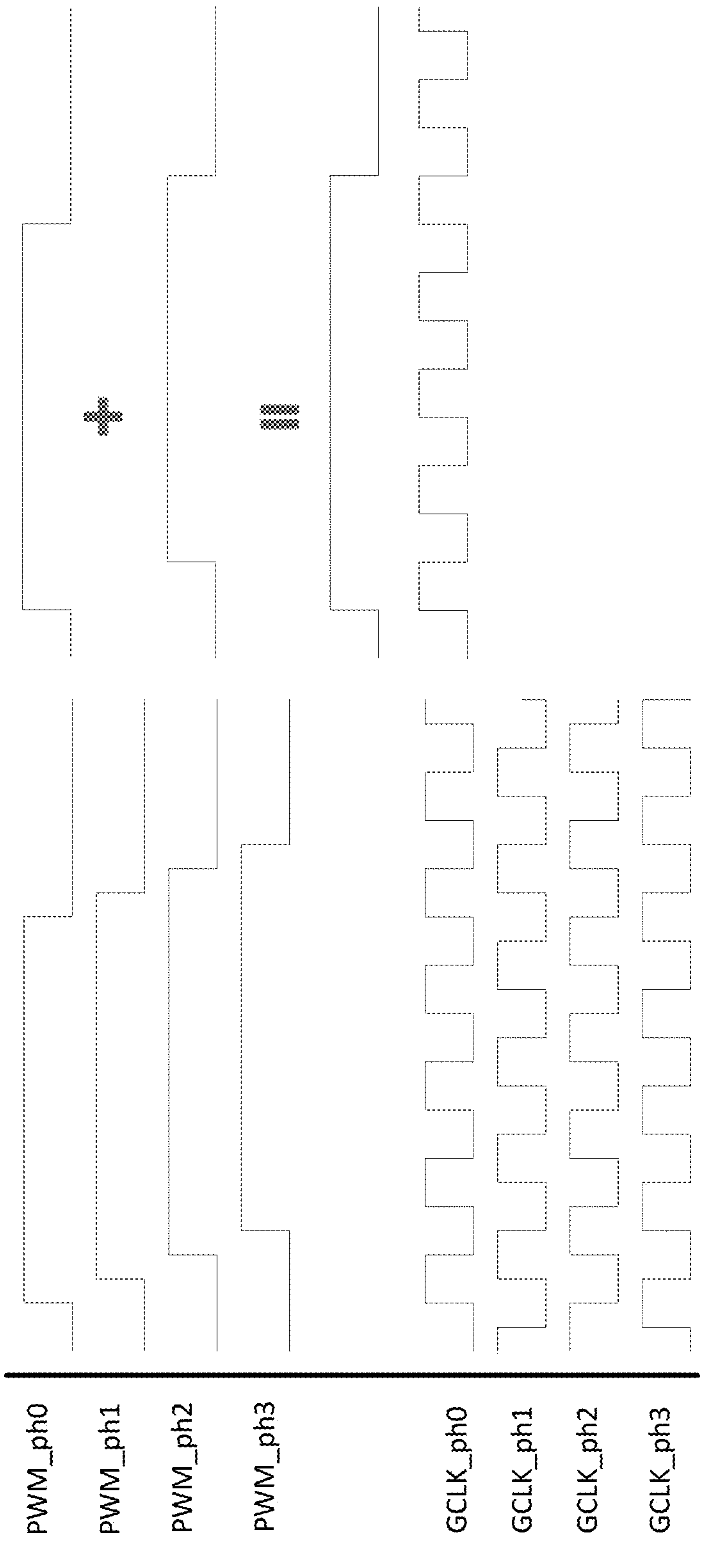
FIG. 4 illustrates the logic operation "OR" of PWM_ph0 and PWM_ph2.

Using the four phases of PWM pulses as the building block, one can use logic operations to generate a varieties of PWM pulses, i.e., fraction PWM or fractional PWM. For example, FIG. 4 shows that the logic operation "OR" of PWM_ph0 and PWM_ph2 creates a pulse having a width of 4½ GCLK. Similarly, the combination of PWM_ph0 and PWM_ph2 generates a pulse having a width of 4¼ GCLK. In a similar fashion, the combination of PWM_ph0 and PWM_ph3 produces a pulse having a width of 4¾ GCLK (not shown).

Figure 5:
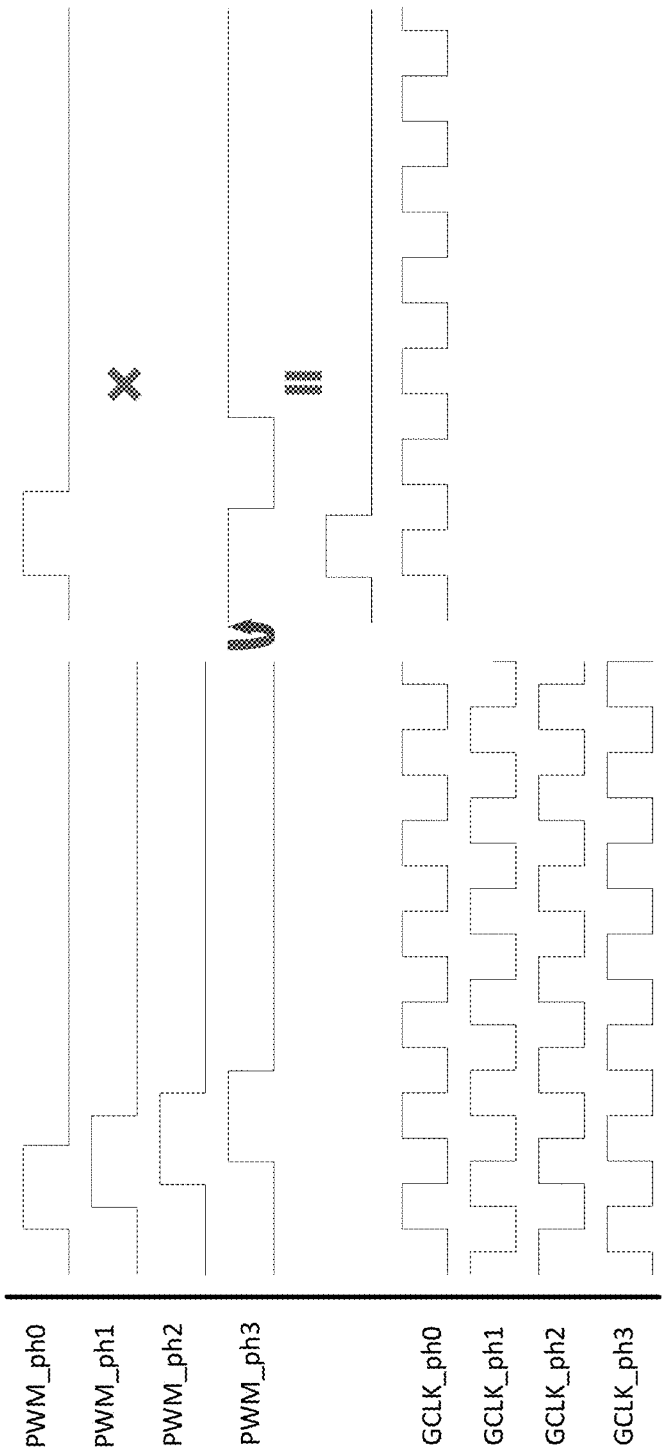
FIG. 5 illustrates the logic operation "AND" of PWM_ph0 and PWM_ph2.

Likewise, logic operation "AND" can generate pulses with a width less than one GLCK. As shown in FIG. 5, each of PWM_ph0, PWM_ph1, PWM_ph2, and PWM_ph3 has a width of one GCLK cycle. Logic operation "AND" of PWM_ph0 and the bar of PWM_ph3 (PWM_ph0 AND $\overline{\text{PWM\_ph3}}$) generates a pulse having a width of ¾ GCLK cycle. Indeed, the logical operation can create pulses of ¼ GLCK cycle in width (e.g., PWM_ph0 AND $\overline{\text{PWM\_ph1}}$) or ½ GLCK cycle in width (e.g., PWM_ph0 AND $\overline{\text{PWM\_ph3}}$).

In this way, combinations of logical operations "AND" and "OR" of four-phase PWM pulses can produce PWM pulses of ¼ GCLK cycle or higher in width, in increments of ¼, ½, or ¾ GLCK cycles. Accordingly, the resolution of the PWM pulse is at least four times of the resolution when the minimum PWM pulse width is one GCLK cycle. Likewise, one may employ more phases in GCLK cycles, e.g., six phases or eight phases, which increase the PWM pulse resolutions to six or eight times of the highest resolution when on a single phase GCLK is used. In theory the phase number can be any number larger than one and the PWM pulse width can be any positive number.

Fraction PWM achieves high resolution PWM pulses without correspondingly increasing the GLCK frequency. For example, when the LED display system requires the LED driver to support 1/64 scan, 16 bits Gray Scale, and 60 Hz frame rate, the required single phase GCLK frequency is at least:

$$2^{16}\times 64\times 60\ \text{Hz}=252\ \text{MHz}$$

When taking LED black out period into consideration, the GCLK frequency is higher. For example, if the black out period occupies 1/10 of frame period, the single phase GCLK frequency becomes 252 MHz×1.1=277 MHz.

In contrast, using fraction PWM with four-phase GCLK to support the same LED system, the GCLK frequency is only ¼ of that of the single phase GCLK:

277 MHz×¼=69.25 MHz.

Figure 6:
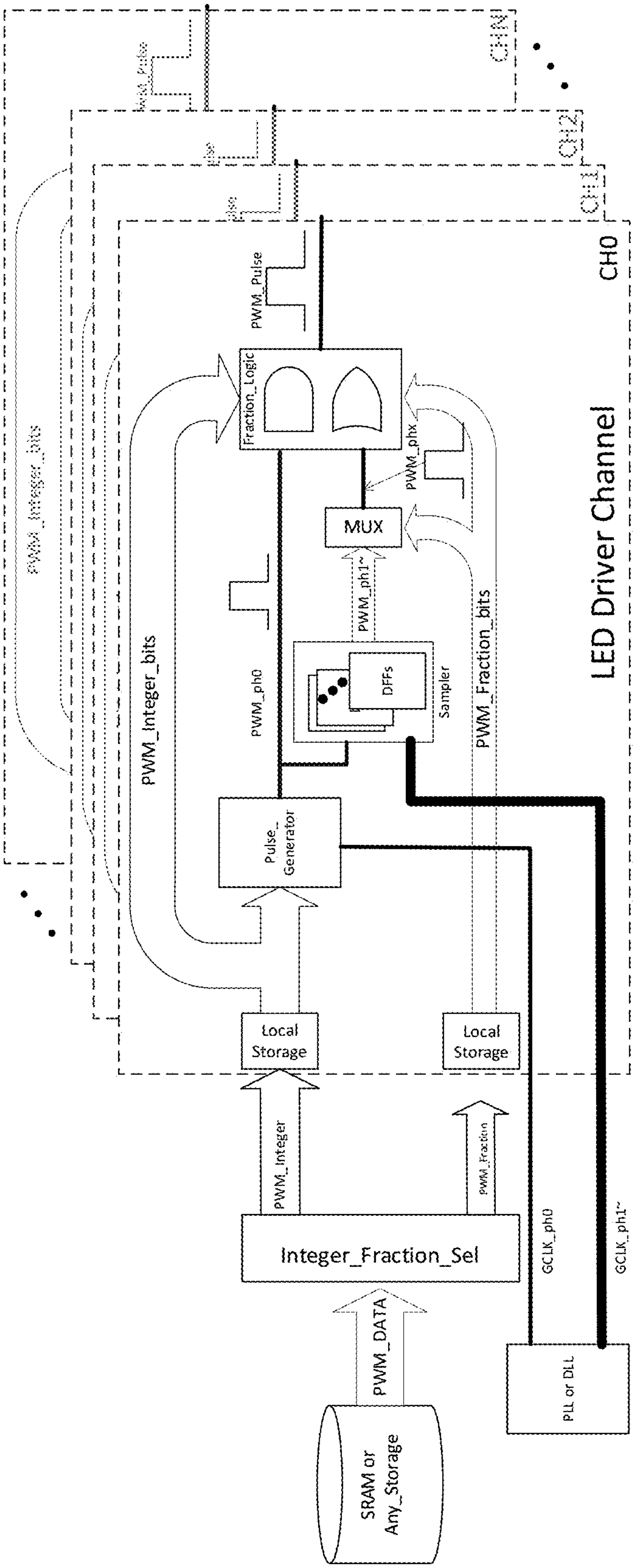
FIG. 6 illustrate an exemplary system of the current disclosure.

FIG. 6 is a schematic block diagram showing the system that implements fraction PWM having four multiple phases of PWM pulses. The system includes a plurality of LED driver channels (i.e., CHO to CHN). Each LED driver channel outputs PWM pulses to be sent to a current source, which in turn generates a driving current to drive an LED channel in an LED array.

A multiphase PLL (Phase Locked Loop) or DLL (Delay Locked Loop) is utilized to generate high-speed, multiple-phase GCLK signals. The PWM data is first stored in a memory, e.g., a SRAM, a register, or any known storage device. During operation, the PWM data is separated into PWM integer and PWM Fraction in the demultiplexer—"Integer_Fraction_Sel." The number of phases in the GCLK signals is determined by the system setting, which matches the fractional changes in the fraction PWM.

Figure 7:
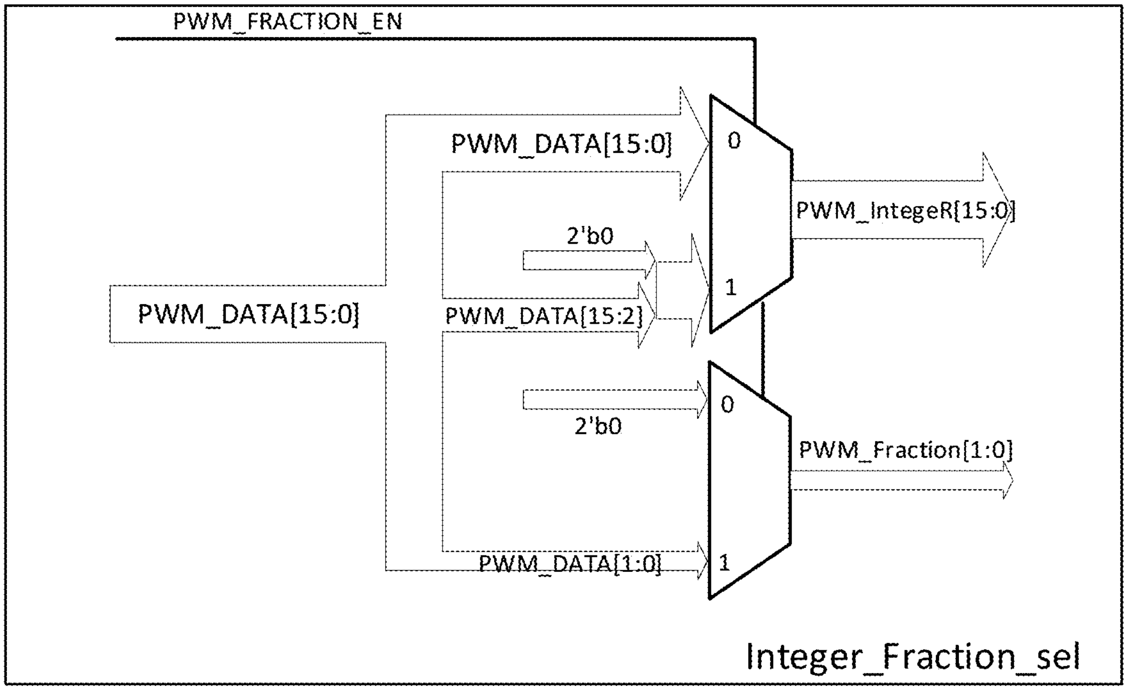
FIG. 7 is a block diagram showing the PWM data being split into integer and fraction.

FIG. 7 is a schematic diagram illustrating the operation of an exemplary "Integer_Fraction_Sel" demultiplexer having two 2×1 MUXs. The input PWM data is split into a fraction section and an integer section according to the system setting. In this example, a 16-bit PWM data (PWM_DATA [15:0]) designates 2 LSB bits (PWM_DATA[1:0]) as the fraction section and the remaining 14 bits (PWM_DATA [15:2]) as the integer section. The "PWM_Fraction_EN" is retrieved from the system setting, which determines the bit number the integer section (PWM_Integer), e.g., 14 or 15 and the bit number fraction section (PWM_Fraction), e.g., 2 or 1.

Referring back to FIG. 6, PWM_Integer and PWM_fraction are then sent to each of the plurality of LED driver channels and stored in their respective local storages, e.g., a SRAM, a register, a DFF, or a latch. PWM_Integer_bits and PWM_Fraction_bits are retrieved from the respective storages during operation. PWM_Integer_bits is sent to Pulse_Generator, which also receives one of the multiphase GLCK signals from the PLL or DLL.

In the embodiment of FIG. 6, the pulse generator receives GCLK_ph0 and outputs PWM_ph0, which has a width of PWM_Integer_bits. PWM_ph0 enters the Sampler and is sampled by the other GCLK phases (GCLK_ph1, GCLK_ph2, GCLK_ph3) and generates PMW pulses (PWM_ph1, PWM_ph2, PWM_ph3, or "PWM_ph1-" in short). The PWM pulses from the Sampler have the same pulse width (PWM_Integer_bits) but come with different phases. These PWM pulses enter a multiplexer (MUX) and are selected by PWM_Fraction_bits retrieved from the local storage to output PWM_phx. The Fraction_Logic block receives PWM_ph0 from the Pulse Generator and PWM_phx from MUX, generating new PWM pulses that result from logic operations of PWM_ph0 and PWM_phx. As explained elsewhere in this disclosure, the new PWM pulses has a higher resolution than that of PWM_ph0, PWM_ph1, PWM_ph2, or PWM_ph3. As such, each LED driver channel outputs fraction PWM pulses to its corresponding current source.

Figure 8:
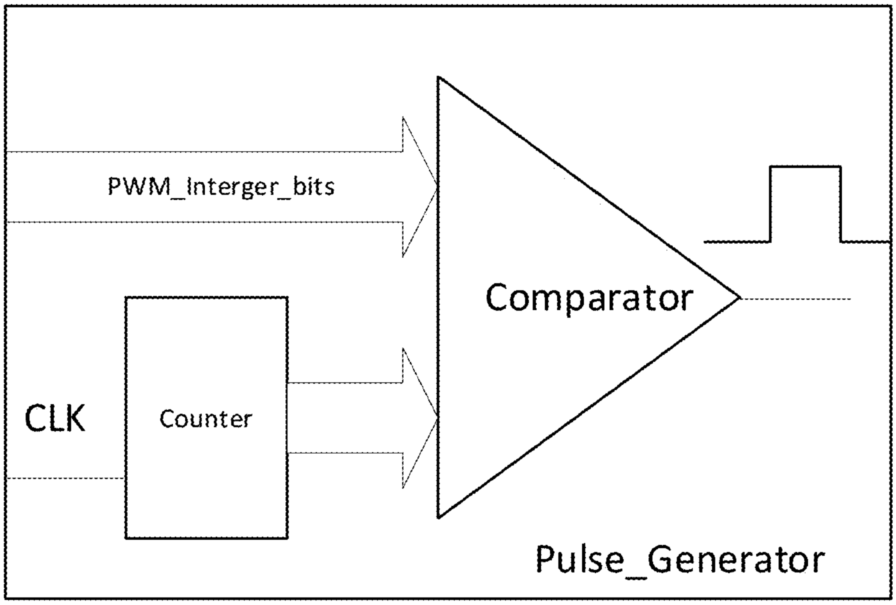
FIG. 8 illustrates an exemplary pulse generator in this disclosure.

FIG. 8 shows more details in the pulse generator circuit, which has a comparator and a counter. PWM_Integer_bits is the target pulse width for pulse generator. The counter in pulse generator starts from "0" and is increased by "1" at the leading edge of GCLK_ph0. The output from the comparator goes HIGH when counting starts and goes LOW when the counter outputs a value that equals PWM_Integer_bits. As such, the pulse generator generates PWM_ph0 having a width of PWM_Integer_bits. The PWM_ph0 is sent to the fraction logic block as well as to the Sampler.

Figure 9:
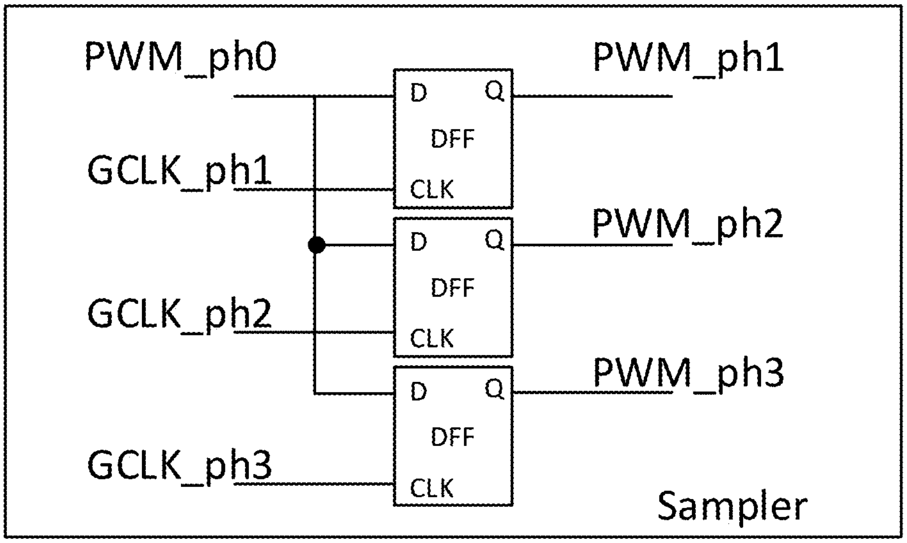
FIG. 9 illustrates an exemplary sampler in this disclosure.

FIG. 9 illustrates the operation of the Sampler. PWM_ph0 is sampled with three D-type flip flops (DFF) In the Sampler circuit. Each DFF takes PWM_ph0 and one of the GCLK of different phases as inputs and generates a PWM pulse according to its input clock phase. As such, outputs from the Sampler line up with different phases of GCLK.

Figure 10:
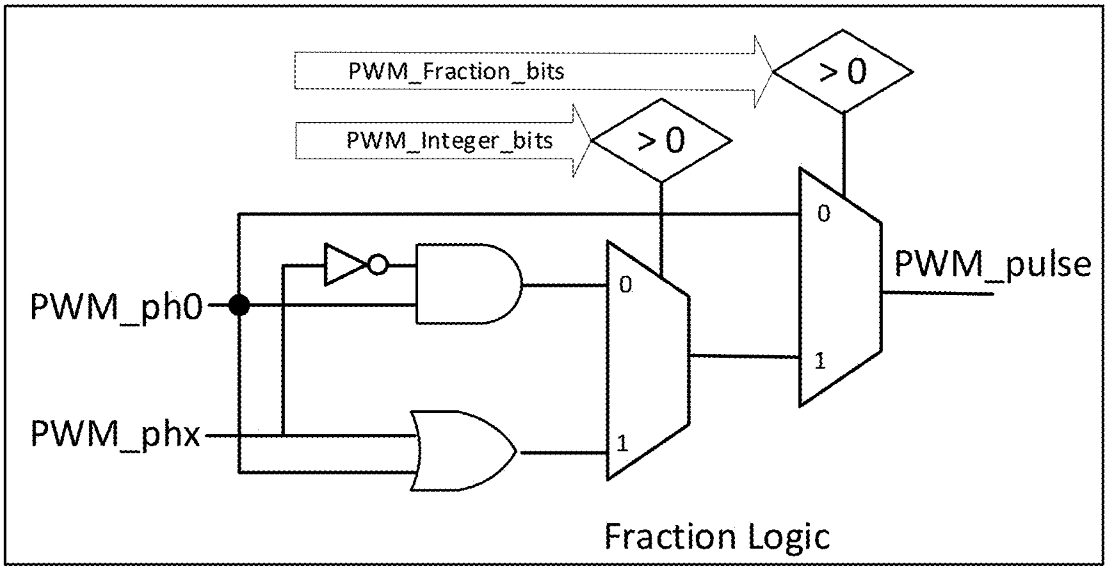
FIG. 10 illustrates the fraction logic in this disclosure.

FIG. 10 shows details in an exemplary Fraction Logic block, which has two comparators, two data selectors, as well as one "AND" gate and one "OR" gate. It receive PWM_ph0 from Pulse Generator and PMW_phx from the Sampler. When PWM_Fraction_bits is "0", there is no fraction PWM so no PWM_phx. The output from the Fraction Logic block is PWM_ph0. When PWM_Fraction_bits is greater than "0" and PWM_Integer_bits is greater than "0", the Fraction Logic block performs the logic operation "OR" of PWM_ph0 and PWM_phx and outputs PWM pulses larger than "1", i.e., the output PWM pulses have a pulse width larger than that of PWM_ph0. When PWM_Fraction_bits is greater than "0" and PWM_Integer_bits is "0", the PWM_pulse is less than "1". In this case, PWM_phx is reversed and logic operation "AND" of the bar of PWM_phx and PWM_ph0 outputs PWM pulses narrower than PWM_ph0 in width.

Other embodiments may adopt GCLK signals and PWM pulses of other than four phases, e.g., from two phases to any number that is operationally feasible. The circuit and system to implement the various embodiments would use similar circuits and devices, only that certain devices are scaled up or scaled down. For example, in a system adopting two-phase GCLK, the Sampler may only employ one DFF and output a single PWM_phx. In contrast, in a system adopting eight-phase GCLK, the Sampler may employ seven DFFs and output seven different PWM_phx.

Figure 11:
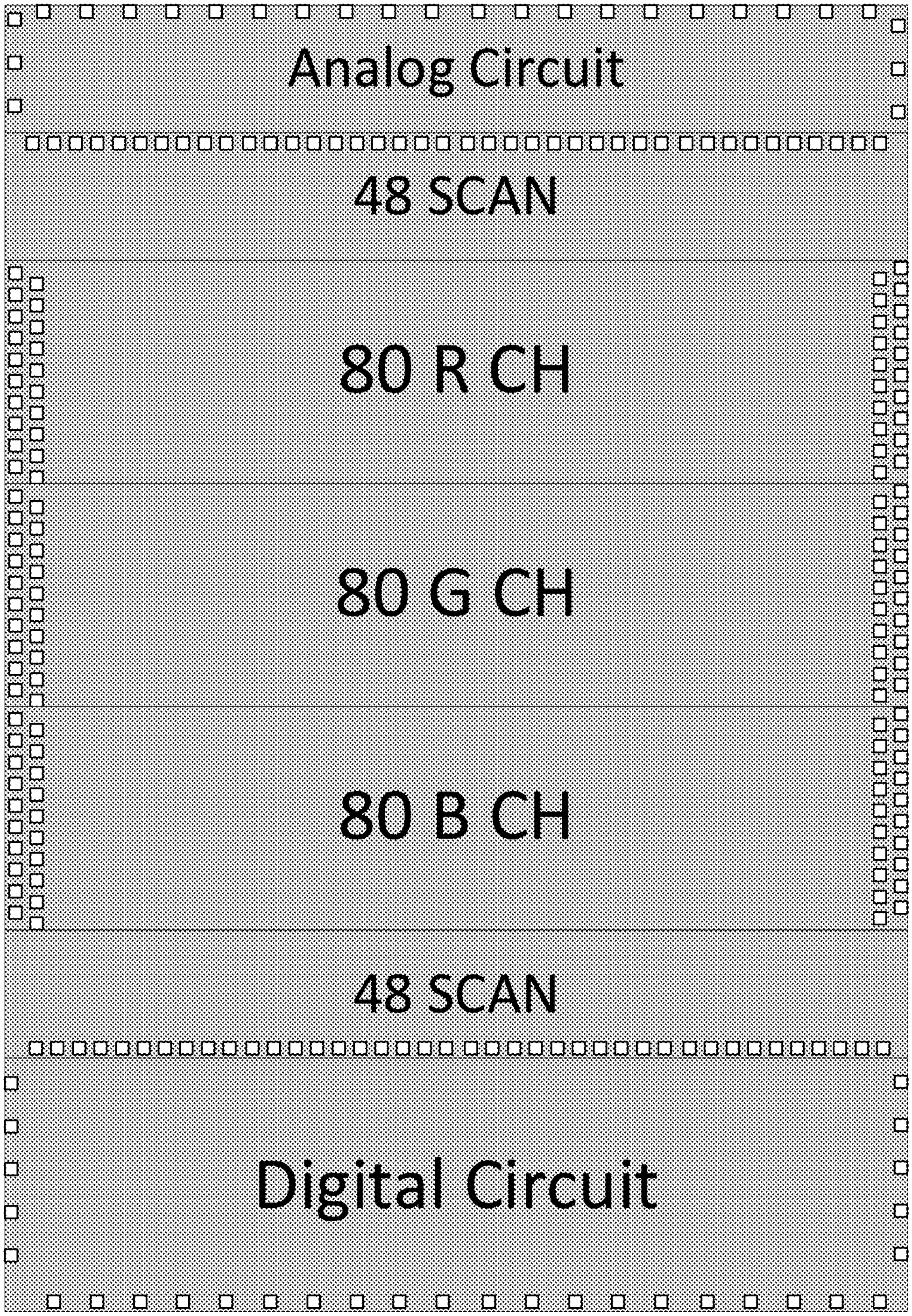
FIG. 11 illustrates a conventional driver chip configuration.
Figure 12:
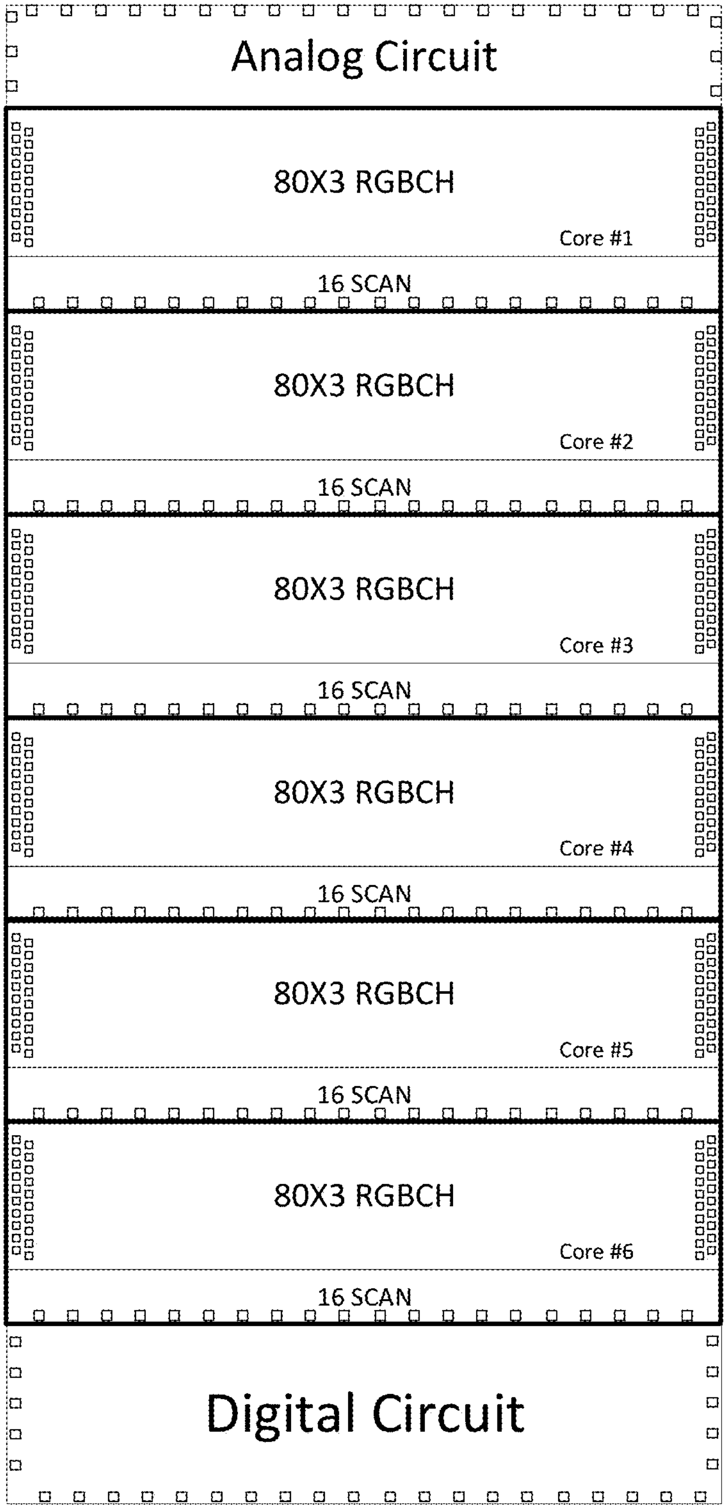
FIG. 12 illustrates an embodiment of driver chip configuration in the current disclosure.

FIG. 12 illustrates an embodiment of a driver chip configuration of the current disclosure. In this exemplary configuration, six LED channel cores (core #1 to core #6) are arrange on a single driver chip along one direction (referred to as "the vertical direction" in this disclosure). Each core has a plurality of constant current drivers that drive 80×3 LED channels (not shown). The driver chip also have six scan cores, each core has a plurality of scan switches disposed thereon. In FIG. 12, each scan core is disposed below an LED channel core, appearing as a strip with 16 contact pads. The number of scan switches on each scan core is determined based on the required rise time $T_r$ so that a number other than 16 scan switches are possible. The LED channel cores can operate in series or in parallel, controlled by the digital circuit disposed on the same driver chip. When the LED channel cores operate serially, they behave in a similar way as the conventional configuration (shown in FIG. 11) does but have a shorter rise time. In this case, the plurality of constant current drivers and scan switches on the driver chip are connected to the same digital circuit and the same analog circuit.

Figure 13:
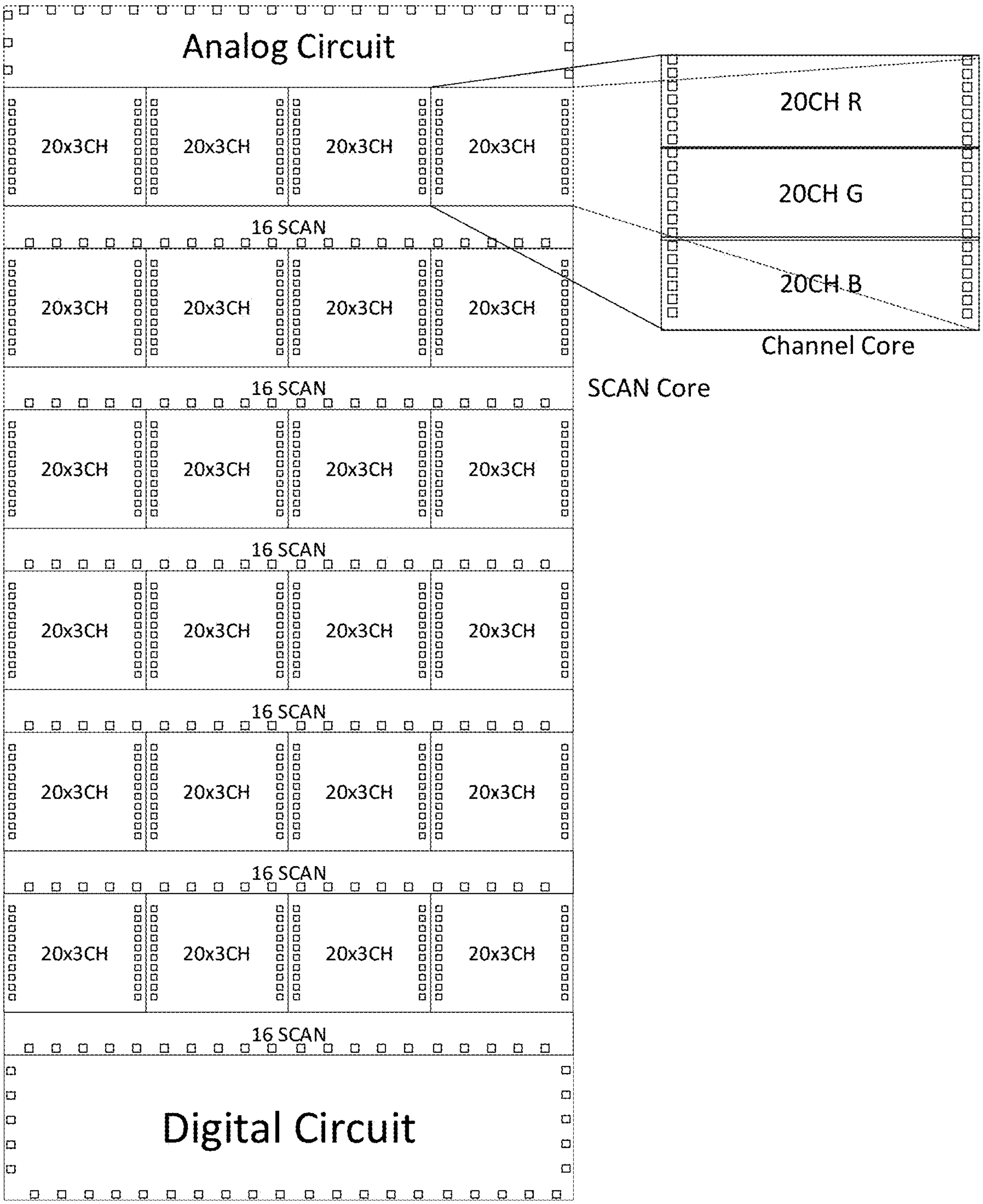
FIG. 13 illustrates another embodiment of driver chip configuration in the current disclosure.

FIG. 13 illustrates another embodiment of a driver chip configuration of the current disclosure. In this configuration, each LED channel core contains a number of constant current sources that drive 20×3 LED channels (not shown). Four LED channel cores are placed in horizontally in a row, which in combination have the same driving capacity as a 80×3 LED channel core. Six rows of LED channel cores are arranged in the vertical direction. Each of the six scan cores are disposed below each row of LED chancel cores.

In the configuration of FIG. 13, the four LED channel cores in the same row operate simultaneously. On the other hand, the six rows of channel cores in vertical direction can operate in serial mode or in parallel mode. When six rows of LED channel cores operate in series, they behave similarly as the conventional type structure does but with a shorter rise time.

In other embodiments, rather than putting the scan switch circuits on a separate scan core, the switch circuits can be integrated on the LED channel core to form an integrated core. For example, each integrated core may have 20×3 (RGB) constant current sources and four scan switches. As such, a driver chip having six rows of four integrated cores each can drive 80×3 LED channels with 96 scans.

The embodiment of fraction PWM as well as the driver chip configuration can be implemented in an LED display system, an example of which is disclosed in In co-pending U.S. application Ser. No. 15/901,712 ("the '712 application"), filed Feb. 21, 2018, the contents in which are incorporated herein by reference. For example, the PLL in the '712 application can be a multiphase PLL of the current disclosure. The PWM in the '712 application can be a fraction PWM of the current disclosure. Further, the integrated driver chip in the '712 application may adopt one of the configurations of the current disclosure.

Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure

What is claimed is:

1. A system for generating pulse width modulation (PWM) pulses to drive an LED array, comprising:

a system clock that outputs n phases of clock signals, wherein n is an integer of 2 or more;

a demultiplexier circuit that separates PWM data into an integer section and a fraction section;

a pulse generator circuit that outputs a first phase PWM pulses using inputs comprising the integer section of the PWM data and a first phase among the n phases of clock signals, a sampler circuit that outputs a second phase PWM pulses using inputs comprising the first phase PWM pulses and the second to n phases of clock signals;

a multiplexer that outputs a selected phase of PWM pulses using inputs comprising the second phase PWM pulses and the fraction section of the PWM data; and a fraction logic circuit that outputs fraction PWM pulses using inputs comprising the first phase PWM pulses, the selected phase of PWM pulses, the integer section of the PWM data, and the fraction section of the PWM data.

2. The system of claim 1, further comprising a plurality of current sources, each current source is configured to receive fraction PWM pulses from the fraction logic circuit and to output a corresponding driving current to an LED array.

3. The system of claim 1, further comprising a first memory for storing the integer section of the PWM data and a second memory for storing the fraction section of the PWM data.

4. The system of claim 3, wherein the system clock, the demultiplexier circuit, the first memory, the second memory, the pulse generator circuit, the sampler circuit, the multiplexer, and the fraction logic circuit are disposed on an LED driver chip.

5. The system of claim 1, wherein n represents 2, 4, 6, 8, 10, or 12.

6. The system of claim 1, wherein the system clock is a phase-locked loop or a delay-locked loop.

7. The system of claim 1, wherein the PWM data is of 16 bits and wherein the fraction section is of one or two bits.

8. The system of claim 1, further comprising a memory for storing the PWM data.

9. The system of claim 1, wherein the fraction logic circuit performs an logic operation of the first phase PWM pulses and the selected phase of PWM pulses to generate fraction PWM pulses.

10. A method for generating PWM pulses, comprising:

generating clock signals having at least a first phase and a second phase using a multiphase system clock;

separating PWM data into an integer section and a fraction section in a demultiplexer;

inputting, into a pulse generator circuit, the integer section of the PWM data and a first phase among the clock signals circuit and outputting a first phase PWM pulses;

inputting, into a sampler circuit, the first phase PWM pulses and the second phase of clock signals and outputting a second phase PWM pulses;

inputting, into a multiplexer, the second phase PWM pulses and the fraction section of the PWM data and outputting a selected phase of PWM pulses; and performing a logic operation of the first phase PWM pulses and the selected phase of PWM pulses in the fraction logic circuit to generate fraction PWM pulses.

11. The method of claim 10, further comprising sending the fraction PWM pluses to a current source, and generating a driving current in the current source.

12. The method of claim 10, further comprising storing the integer section of the PWM data in a first memory and storing the fraction section of the PWM data in a second memory; and retrieving the integer section of the PWM data from the first memory and retrieving the fraction section from the PWM data in a second memory.

13. A method for generating fractional PWM pulses to drive an light emitting device, comprising:

generating multiphase clock signals using a fractional phase-locked loop or a fractional delay-locked loop;

generating a plurality of phases of PWM pulses that correspond to a number of phases of the multiphase clock signals;

selecting two or more phases amongst the plurality of PWM pulses;

performing logic operations of the selected phases of PWM pulses to generate fractional PWM pulses;

generating a driving current using the fractional PWM pulses in a current source.

14. The method of claim 13, wherein the multiphase clock signals have 2 to 12 phases.

15. The method of claim 13, wherein the light emitting device is an LED display comprising an LED array having a plurality of channels and a plurality of scan lines, and the driving current drives LEDs in one of the plurality of channels.

* * * * *